United States Patent
Muwonge et al.

(10) Patent No.: US 11,071,213 B2
(45) Date of Patent: Jul. 20, 2021

(54) METHODS OF MANUFACTURING A HIGH IMPEDANCE SURFACE (HIS) ENHANCED BY DISCRETE PASSIVES

(71) Applicant: The Boeing Company, Chicago, IL (US)

(72) Inventors: Charles Muwonge, Andover, MA (US); Kyu-Pyung Hwang, Newton, MA (US); Terry Vogler, Charleston, SC (US); Young Kyu Song, San Diego, CA (US)

(73) Assignee: The Boeing Company, Chicago, IL (US)

(*) Notice: Subject to any disclaimer, the term of this patent is extended or adjusted under 35 U.S.C. 154(b) by 189 days.

(21) Appl. No.: 16/521,505

(22) Filed: Jul. 24, 2019

(65) Prior Publication Data

US 2021/0029836 A1    Jan. 28, 2021

(51) Int. Cl.
*H05K 3/42* (2006.01)
*H05K 3/44* (2006.01)
(Continued)

(52) U.S. Cl.
CPC .......... *H05K 3/428* (2013.01); *H05K 1/0251* (2013.01); *H05K 1/113* (2013.01); *H05K 1/116* (2013.01);
(Continued)

(58) Field of Classification Search
CPC ...... H05K 1/0251; H05K 1/113; H05K 1/116; H05K 1/162; H05K 1/165; H05K 3/0038;
(Continued)

(56) References Cited

U.S. PATENT DOCUMENTS 4,349,862 A * 9/1982 Bajorek ................. H01L 23/15
174/258
4,551,746 A * 11/1985 Gilbert ................. H01L 23/057
257/691
(Continued)

OTHER PUBLICATIONS

Rea et al.; "Broadband high-impedance surface design for aircraft HIRF protection"; IEE Proc.—Microw. Antennas Propag., vol. 153, No. 4, Aug. 2006; p. 307-313.
(Continued)

*Primary Examiner* — Carl J Arbes
(74) *Attorney, Agent, or Firm* — Haynes and Boone, LLP

(57) ABSTRACT

In one or more embodiments, a method of manufacturing a high impedance surface (HIS) apparatus comprises patterning a first conducting layer on a core to form a first set of conducting pads, and patterning a second conducting layer on the core to form a second set of conducting pads. The method further comprises applying solder paste to each of the conducting pads of the second set of conducting pads. Also, the method comprises placing chip capacitors on the solder paste on the second set of conducting pads. In addition, the method comprises applying underfill between the chip capacitors. Also, the method comprises applying solder paste to each of the conducting pads of the first set of conducting pads. In addition, the method comprises placing chip inductors on the solder paste on the first set of conducting pads. Further, the method comprises applying underfill between the chip inductors.

20 Claims, 17 Drawing Sheets

(51) Int. Cl.
*H05K 3/00* (2006.01)
*H05K 1/11* (2006.01)
*H05K 1/16* (2006.01)
*H05K 1/02* (2006.01)
*H05K 3/06* (2006.01)

(52) U.S. Cl.
CPC ............ *H05K 1/162* (2013.01); *H05K 1/165* (2013.01); *H05K 3/0038* (2013.01); *H05K 3/0047* (2013.01); *H05K 3/06* (2013.01); *H05K 3/44* (2013.01)

(58) Field of Classification Search
CPC ........ H05K 3/0047; H05K 3/06; H05K 3/428; H05K 3/44
See application file for complete search history.

(56) References Cited

U.S. PATENT DOCUMENTS

| | | | | | |
|---|---|---|---|---|---|
| 4,551,747 | A | * | 11/1985 | Gilbert | ................. H01L 23/057 257/691 |
| 5,177,670 | A | * | 1/1993 | Shinohara | ............... H01L 23/36 174/253 |
| 6,952,049 | B1 | * | 10/2005 | Ogawa | ................... H01L 23/13 257/700 |
| 7,136,028 | B2 | | 11/2006 | Ramprasad et al. | |
| 7,863,524 | B2 | * | 1/2011 | Shioga | ............. H01L 23/49827 174/260 |
| 7,982,139 | B2 | * | 7/2011 | Kariya | ................... H05K 1/162 174/260 |
| 8,389,870 | B2 | * | 3/2013 | Bills | ..................... H05K 1/024 174/261 |
| 10,020,277 | B2 | * | 7/2018 | Iguchi | ................... H01L 23/528 |

OTHER PUBLICATIONS

Mias et al; "A Varactor-Tunable High Impedance Surface With a Resistive-Lumped-Element Biasing Grid"; IEEE Transactions on Antennas and Propagation, vol. 55, No. 7, Jul. 2007; p. 1955-1962.

Sievenpiper et al.; "High-Impedance Electromagnetic Surfaces with a Forbidden Frequency Band"; IEEE Transactions on Microwave Theory and Techniques, vol. 47, No. 11, Nov. 1999; p. 2059-2074.

Kamgaing et al.; "Design and Modeling of High-Impedance Electromagnetic Surfaces for Switching Noise Suppression in Power Planes"; IEEE Transactions on Electromagnetic Compatibility, vol. 47, No. 3, Aug. 2005; p. 479-489.

Czeresko III et al.; "EBG Design and Analysis for Wideband Isolation Improvement between Aircraft Blade Monopoles"; Boeing Corporation, Nov. 12, 2018, p. 1-9.

* cited by examiner

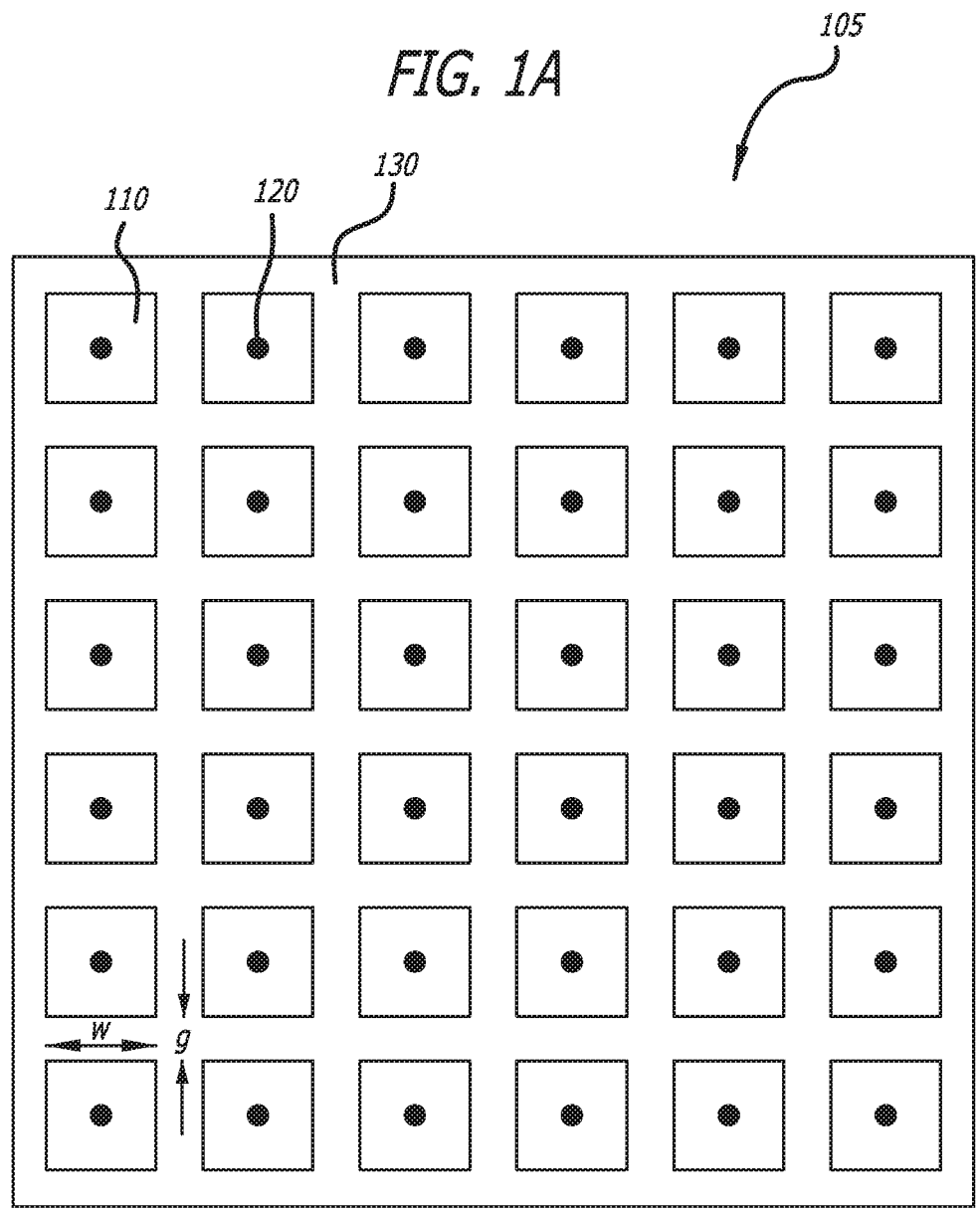

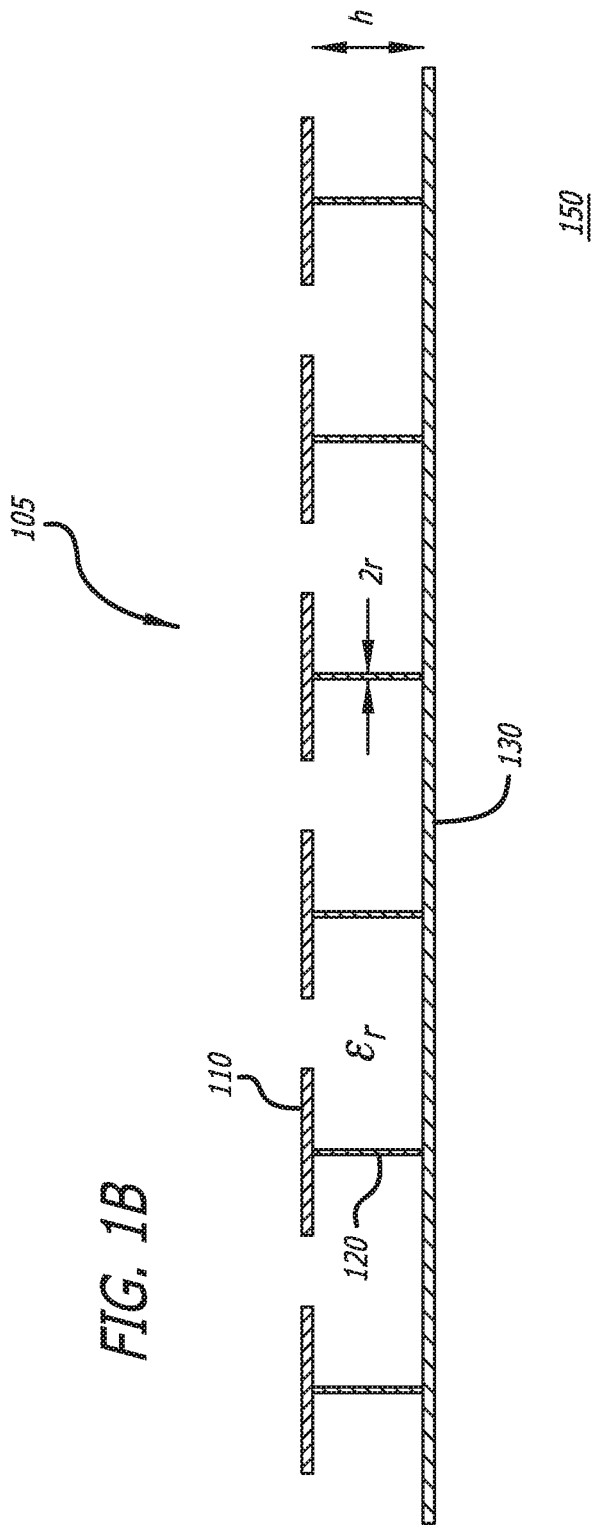

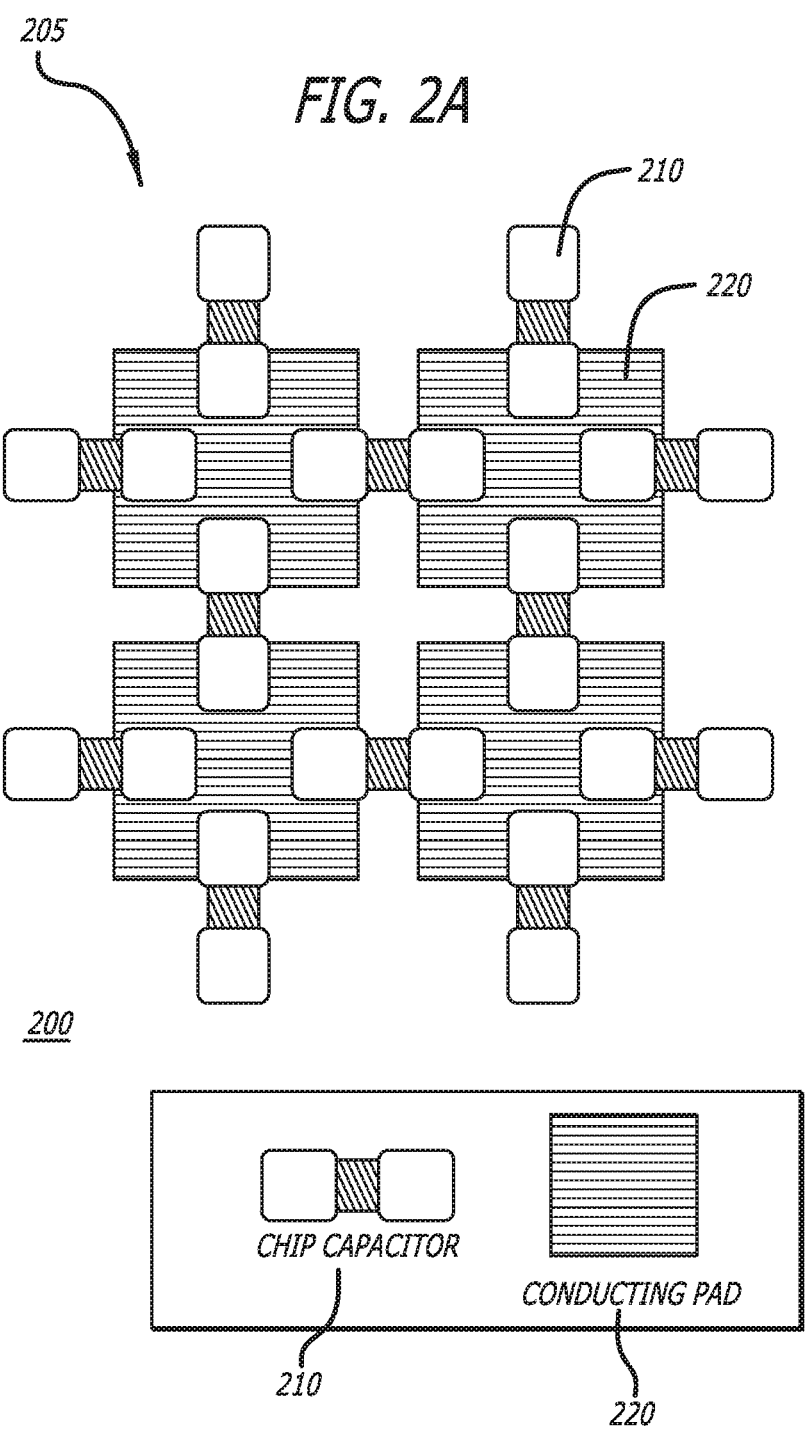

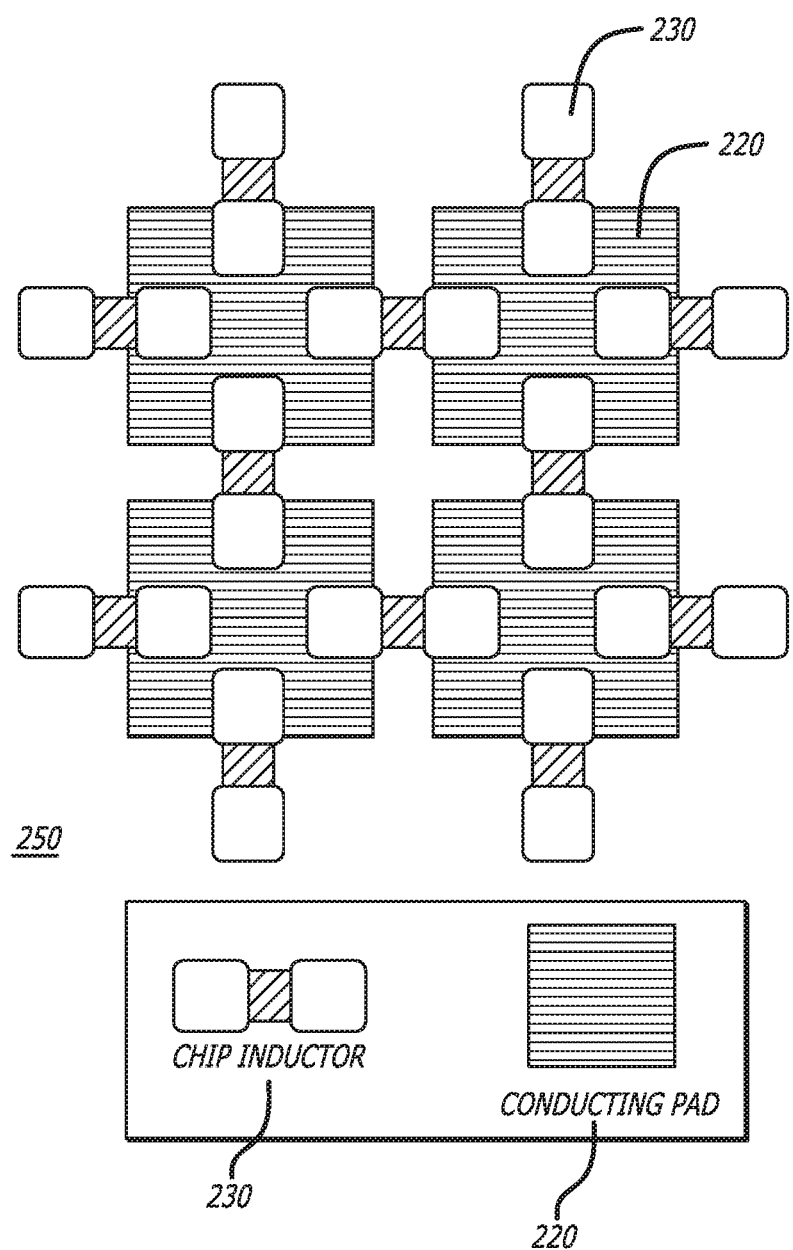

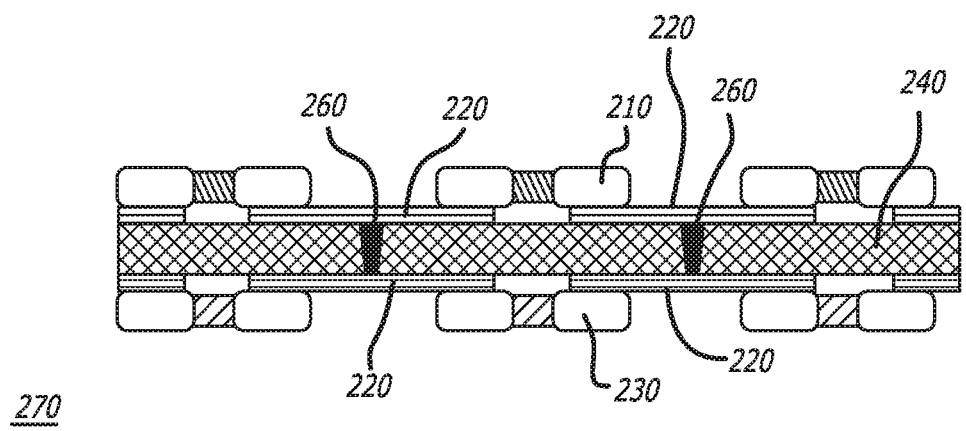
FIG. 2C
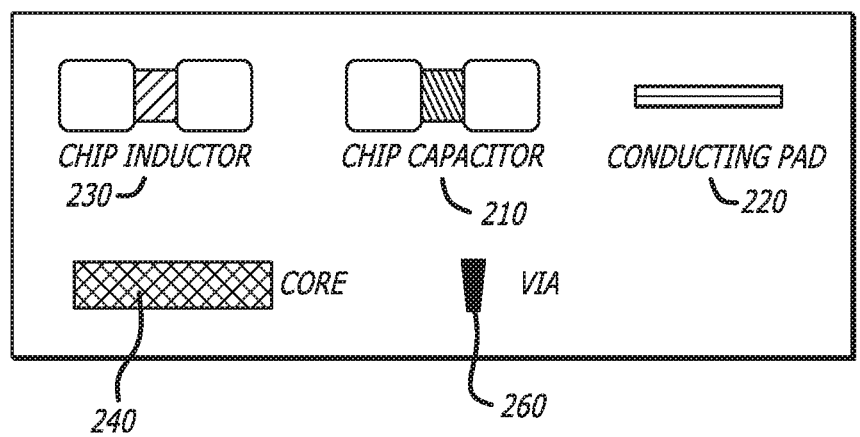

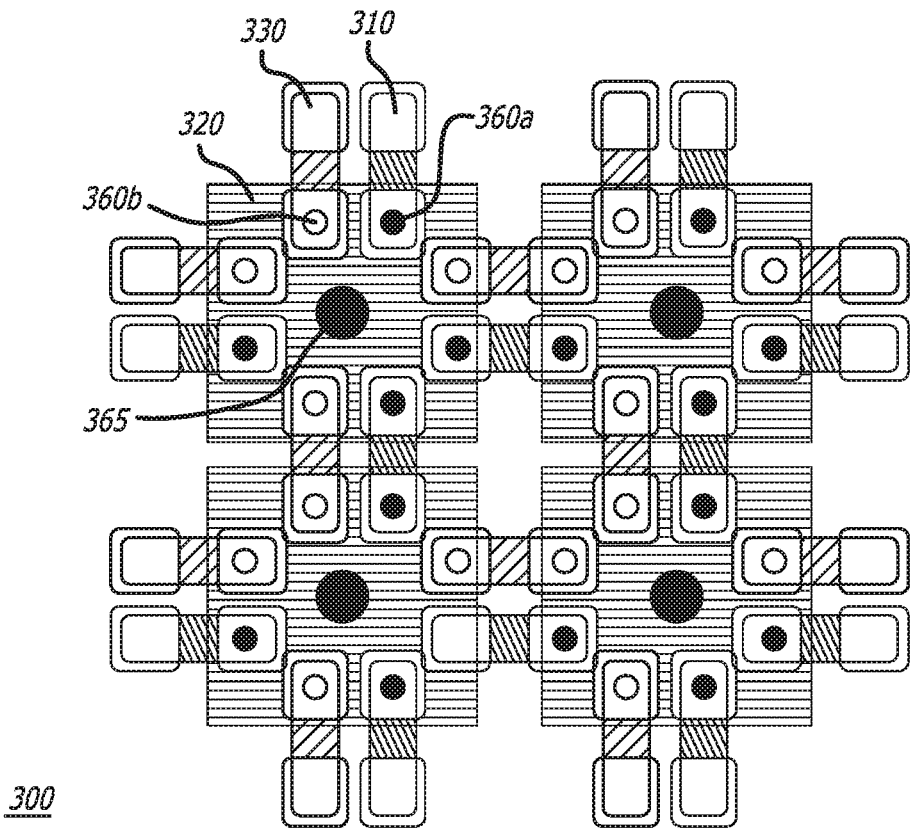
FIG. 3A
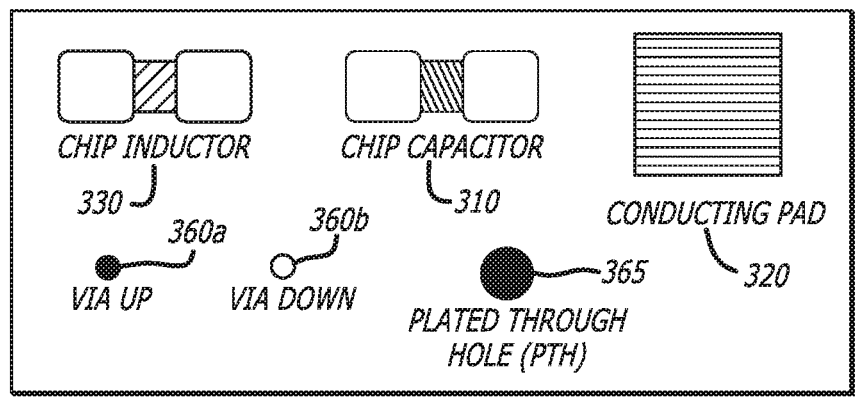

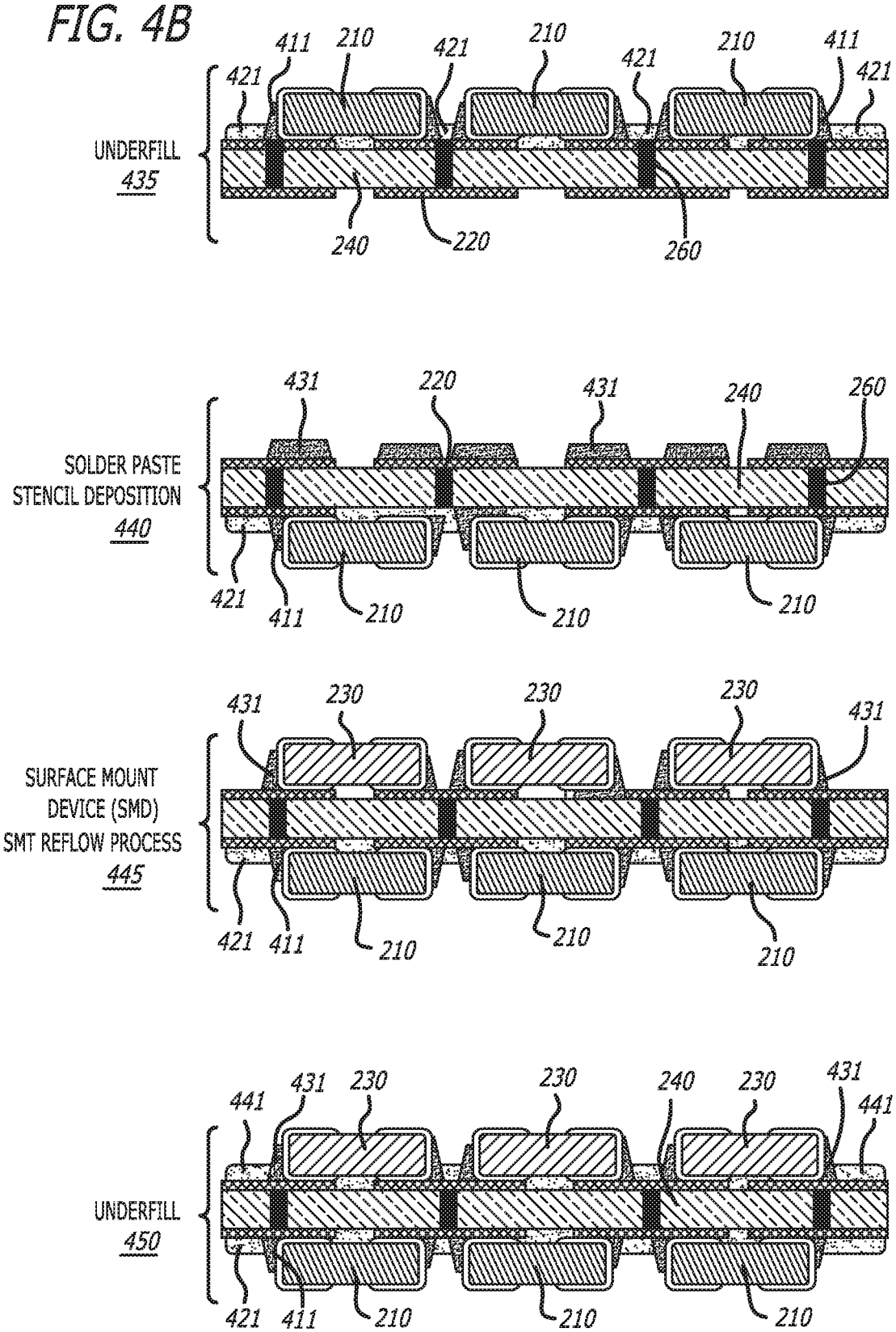

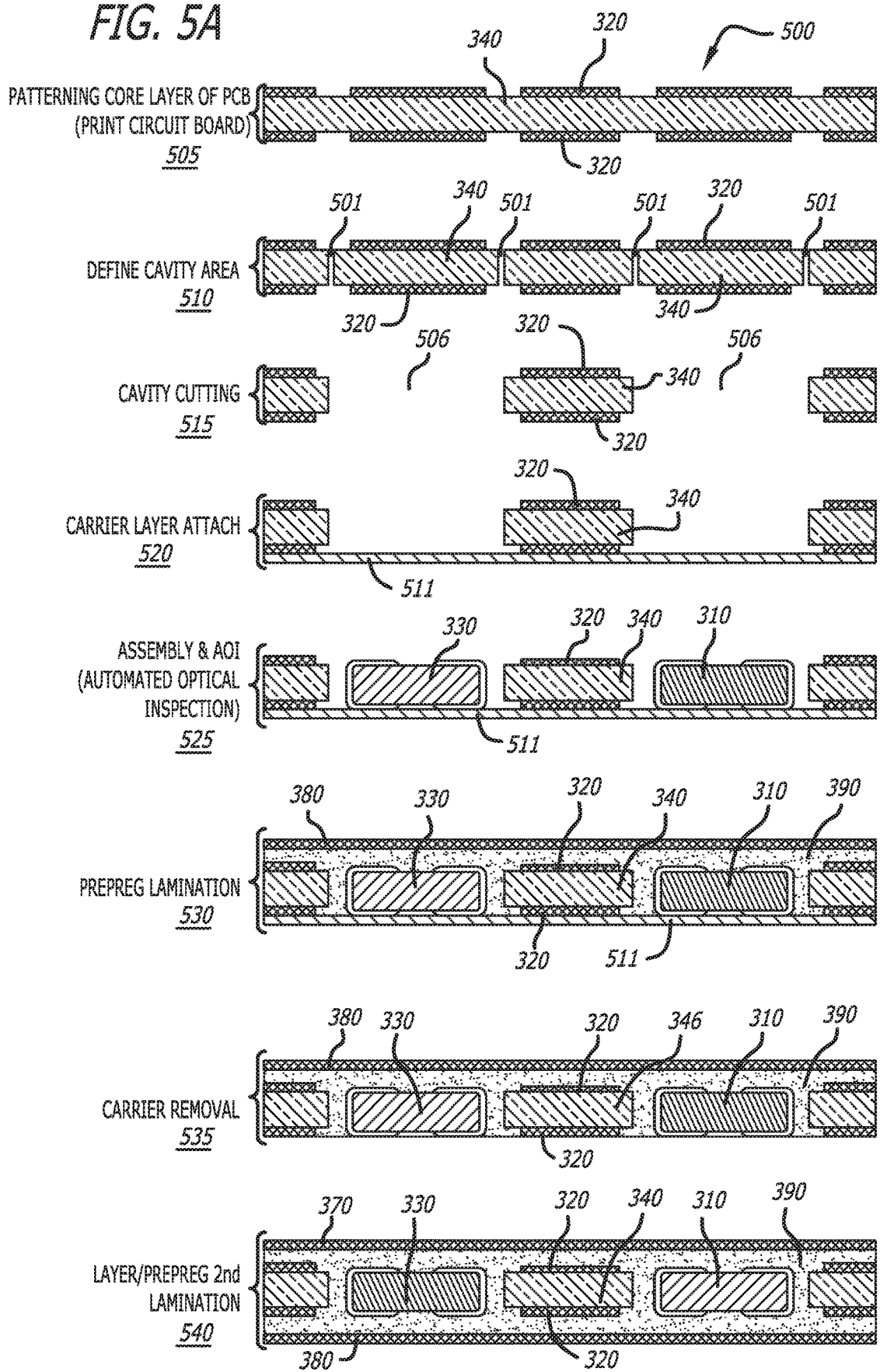

METHODS OF MANUFACTURING A HIGH IMPEDANCE SURFACE (HIS) ENHANCED BY DISCRETE PASSIVES

FIELD

The present disclosure relates to high impedance surfaces. In particular, the present disclosure relates to high impedance surfaces enhanced by discrete passives.

BACKGROUND

Currently, conventional high impedance surfaces in electromagnetic (EM) frequencies typically comprise of periodic arrays of bare metallic mushroom-shaped unit cell conductors on a ground plane (e.g., refer to device 105 of FIGS. 1A and 1B). For practical applications in printed circuit boards (PCBs), antennas, and other devices, these conventional high impedance surfaces are very bulky in size and heavy in weight.

To realize effective inductance and capacitance for stop bands in low frequencies, these conventional high impedance surfaces require large unit cell structures, thereby requiring thick metallic panels and large areas. Even so, these conventional high impedance surfaces generally have stop bands that only cover high frequency ranges (greater than (>) Gigahertz (GHz)) with limited bandwidth, which are not in the Megahertz (MHz) ranges where most of the spectral energy in digital noise signals exists. In light of the foregoing, there is a need for improved high impedance surfaces.

SUMMARY

The present disclosure relates to a method, system, and apparatus for a high impedance surface (HIS) enhanced by discrete passives. In one or more embodiments, a HIS apparatus, wherein the apparatus comprises a core. The apparatus further comprises a first set of conducting pads, where a first side of the first set of conducting pads is connected to a first side of the core. Also, the apparatus comprises a second set of conducting pads, where a first side of the second set of conducting pads is connected to a second side of the core. In addition, the apparatus comprises a plurality of chip inductors, where at least a portion of the chip inductors are connected to a second side of the first set of conducting pads. Further, the apparatus comprises a plurality of chip capacitors, where at least a portion of the chip capacitors are connected to a second side of the second set of conducting pads.

In one or more embodiments, the first set of conducting pads and the second set of conducting pads are connected to each other by at least one via running through the core. In at least one embodiment, the first set of conducting pads is arranged in an array. In some embodiments, the second set of conducting pads is arranged in an array.

In at least one embodiment, the first set of conducting pads lie in a plane. In some embodiments, the second set of conducting pads lie in a plane.

In one or more embodiments, the chip inductors are connected to the first set of conducting pads in a symmetric pattern. In at least one embodiment, the chip capacitors are connected to the second set of conducting pads in a symmetric pattern.

In at least one embodiment, the first set of conducting pads and the second set of conducting pads comprise a metal. In some embodiments, the core is mechanically flexible such that the apparatus is conformable.

In one or more embodiments, a HIS apparatus comprises a first set of conducting pads, a second set of conducting pads, a plurality of cores, a plurality of chip inductors, and a plurality of chip capacitors. In one or more embodiments, the cores are embedded between the first set of conducting pads and the second set of conducting pads.

In at least one embodiment, the first set of conducting pads and the second set of conducting pads are connected to each other by at least one plated through hole (PTH) running through each of the conducting pads of the first set of conducting pads and the second set of conducting pads and through each of the cores. In some embodiments, the chip inductors are connected to at least one laminate by at least one via. In at least one embodiment, the chip capacitors are connected to at least one laminate by at least one via. In one or more embodiments, the cores, the chip inductors, and the chip capacitors are embedded in a dielectric epoxy.

In one or more embodiments, the first set of conducting pads is arranged in an array. In some embodiments, the second set of conducting pads is arranged in an array.

In at least one embodiment, the first set of conducting pads lie in a plane. In some embodiments, the second set of conducting pads lie in a plane. In one or more embodiments, the cores, the chip inductors, and the chip capacitors lie in a plane.

In one or more embodiments, the first set of conducting pads and the second set of conducting pads comprise a metal. In at least one embodiment, each of the cores is located between one of the chip inductors and one of the chip capacitors. In some embodiments, the cores are mechanically flexible such that the apparatus is conformable.

In at least one embodiment, a method of manufacturing a HIS apparatus comprises patterning a first conducting layer on a core to form a first set of conducting pads. The method further comprises patterning a second conducting layer on the core to form a second set of conducting pads. Also, the method comprises drilling cavities that run through the first set of conducting pads, the core, and the second set of conducting pads. In addition, the method comprises forming a via in each of the cavities. Also, the method comprises plating (e.g., with a metal, such as copper (Cu)) a surface of each of the conducting pads of the first set of conducting pads and the second set of conducting pads. In addition, the method comprises applying solder paste to each of the conducting pads of the second set of conducting pads. Additionally, the method comprises placing chip capacitors on the solder paste on the second set of conducting pads. Also, the method comprises reflowing the solder paste on the second set of conducting pads. In addition, the method comprises applying underfill between the chip capacitors. Additionally, the method comprises applying solder paste to each of the conducting pads of the first set of conducting pads. Also, the method comprises placing chip inductors on the solder paste on the first set of conducting pads. In addition, the method comprises reflowing the solder paste on the first set of conducting pads. Further, the method comprises applying underfill between the chip inductors.

In one or more embodiments, the cavities are drilled by laser drilling and/or mechanical drilling. In some embodiments, the surface of each of the conducting pads of the first set of conducting pads and the second set of conducting pads is plated with a metal. In at least one embodiment, the solder paste is applied to each of the conducting pads of the first set of conducting pads and the second set of conducting pads through stencil deposition. In some embodiments, the underfill between the chip capacitors and the underfill in between the chip inductors is a dielectric epoxy. In one or more embodiments, the core is a printed circuit board (PCB) core.

In at least one embodiment, a method of manufacturing a high impedance surface (HIS) apparatus comprises patterning a first conducting layer on a core to form a first set of conducting pads. The method further comprises patterning a second conducting layer on the core to form a second set of conducting pads. Also, the method comprises drilling small cavities that run through the core to form a plurality of cores. In addition, the method comprises cutting large cavities that are defined by the small cavities. Additionally, the method comprises attaching a carrier to a surface of the second set of conducting pads.

Also, the method comprises placing chip capacitors and chip inductors in the large cavities. In addition, the method comprises applying underfill between the chip inductors and the chip capacitors. Additionally, the method comprises applying a second laminate (e.g., copper foil) proximate a surface of the first set of conducting pads. Also, the method comprises removing the carrier. In addition, the method comprises applying a first laminate (e.g., copper foil) proximate the surface of the second set of conducting pads. Additionally, the method comprises drilling via cavities through the second laminate and the underfill to the chip inductors, through the first laminate and the underfill to the chip capacitors, and through the first laminate, the underfill, the conducting pads of the first set of conducting pads and the second set of conducting pads, and the plurality of the cores to the second laminate. Also, the method comprises forming a via and/or a plated through hole (PTH) in each of the via cavities. Further, the method comprises etching the first laminate and the second laminate.

In one or more embodiments, the small cavities are drilled by laser drilling and/or mechanical drilling. In at least one embodiment, the large cavities are drilled by laser drilling and/or mechanical drilling. In some embodiments, the via cavities are drilled by laser drilling and/or mechanical drilling.

In at least one embodiment, the carrier is a substrate. In one or more embodiments, the first laminate and the second laminate are a metal, such as copper (Cu). In some embodiments, the underfill is a dielectric epoxy. In at least one embodiment, the first laminate and the second laminate are etched by photolithography. In one or more embodiments, the core is a printed circuit board (PCB) core.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

FIG. 1A is a diagram showing a top view of a conventional high impedance surface (HIS) device.

FIG. 1B is a diagram showing a side view of the conventional HIS device of FIG. 1A.

FIG. 2A is a diagram showing a top view of the disclosed surface-mount technology (SMT) type HIS device, in accordance with at least one embodiment of the present disclosure.

FIG. 2B is a diagram showing a bottom view of the disclosed SMT type HIS device of FIG. 2A, in accordance with at least one embodiment of the present disclosure.

FIG. 2C is a diagram showing a side view of the disclosed SMT type HIS device of FIGS. 2A and 2B, in accordance with at least one embodiment of the present disclosure.

FIG. 3A is a diagram showing a top view of the disclosed embedded type HIS device, in accordance with at least one embodiment of the present disclosure.

FIGS. 4A and 4B are diagrams that together illustrate the disclosed method of manufacture for the disclosed SMT type HIS device (e.g., refer to device 205 of FIGS. 2A, 2B, and 2C), in accordance with at least one embodiment of the present disclosure.

FIGS. 5A and 5B are diagrams that together illustrate the method of manufacture for the disclosed embedded type HIS device (e.g., refer to device 305 of FIGS. 3A and 3B), in accordance with at least one embodiment of the present disclosure.

Figure 6A:
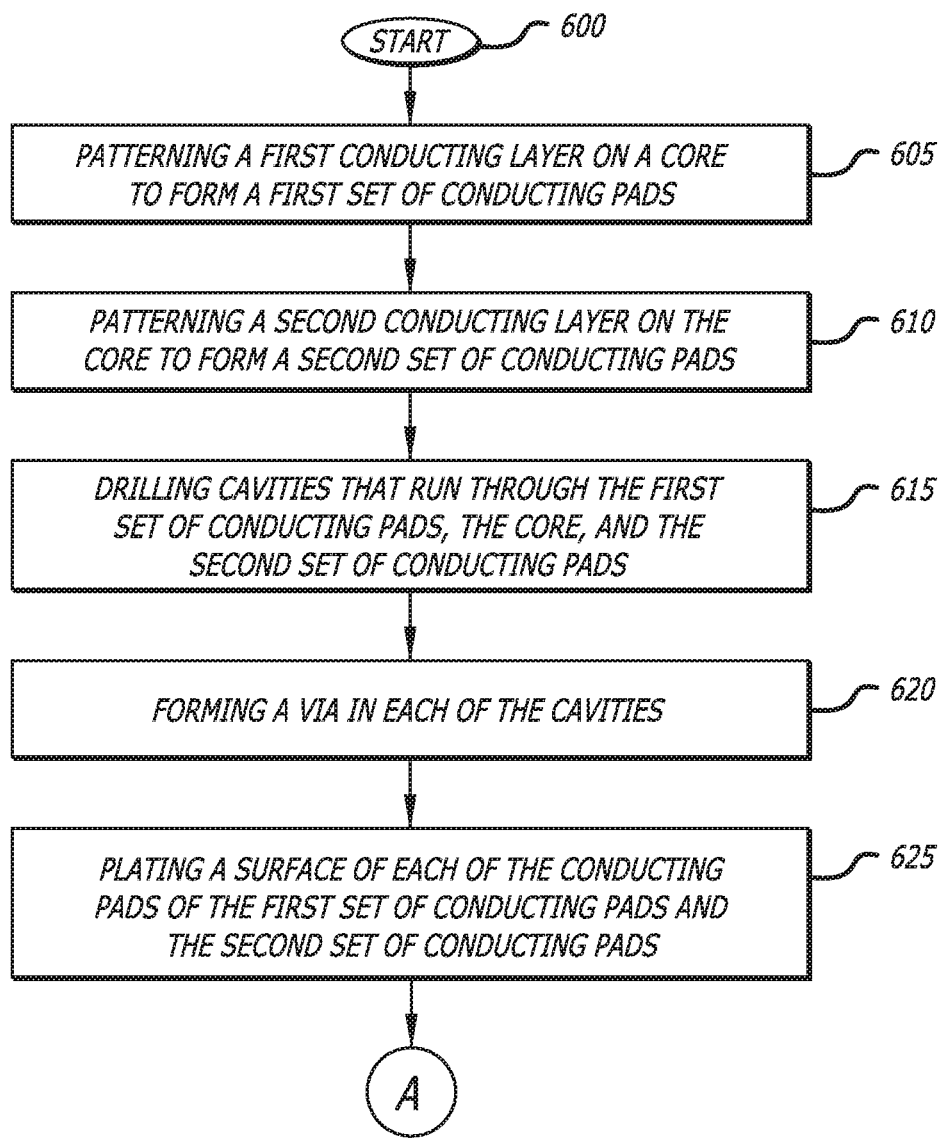
Figure 6B:
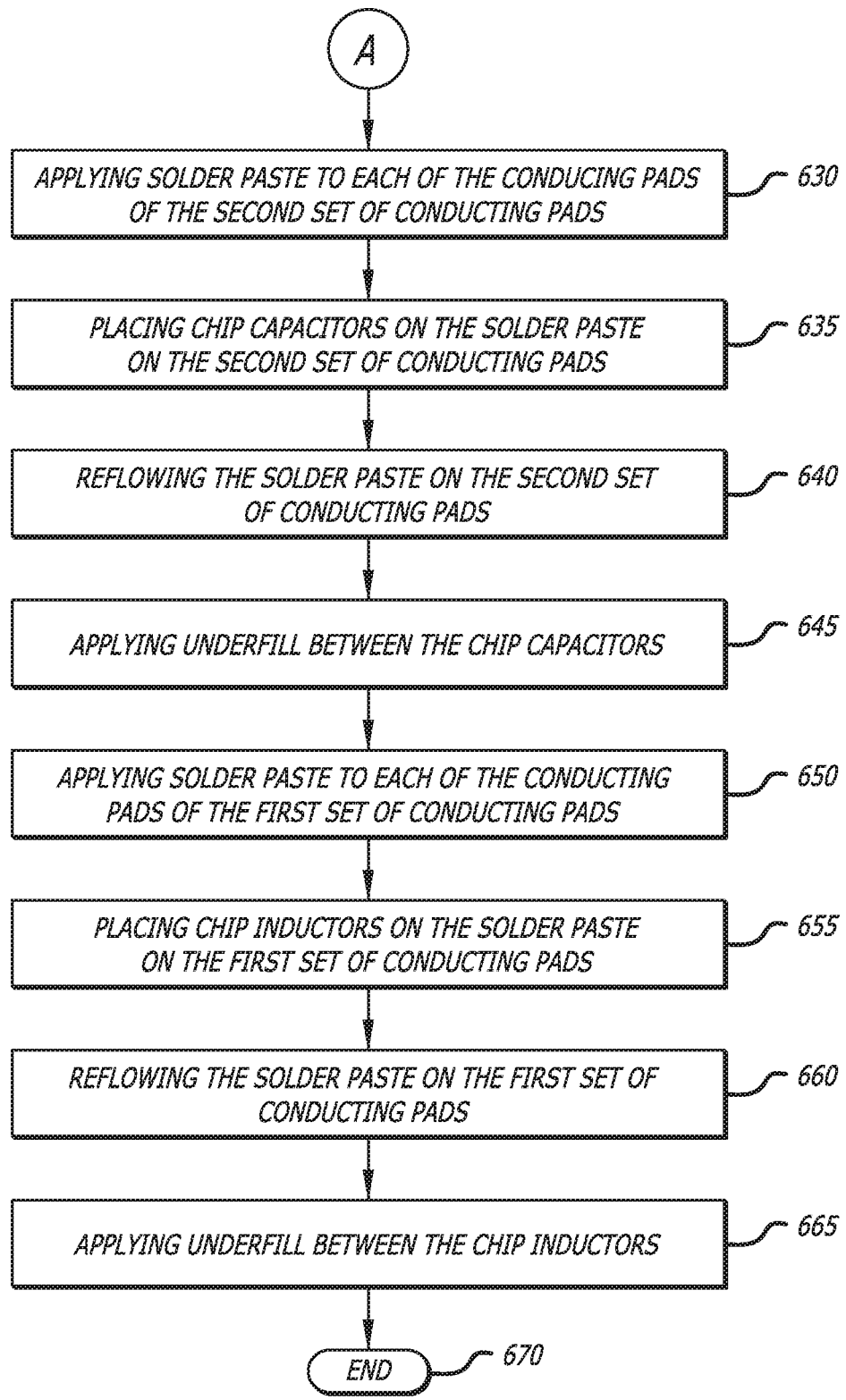

FIGS. 6A and 6B together are a flow chart showing the disclosed method of manufacture for the disclosed SMT type HIS device (e.g., refer to device 205 of FIGS. 2A, 2B, and 2C), in accordance with at least one embodiment of the present disclosure.

Figure 7A:
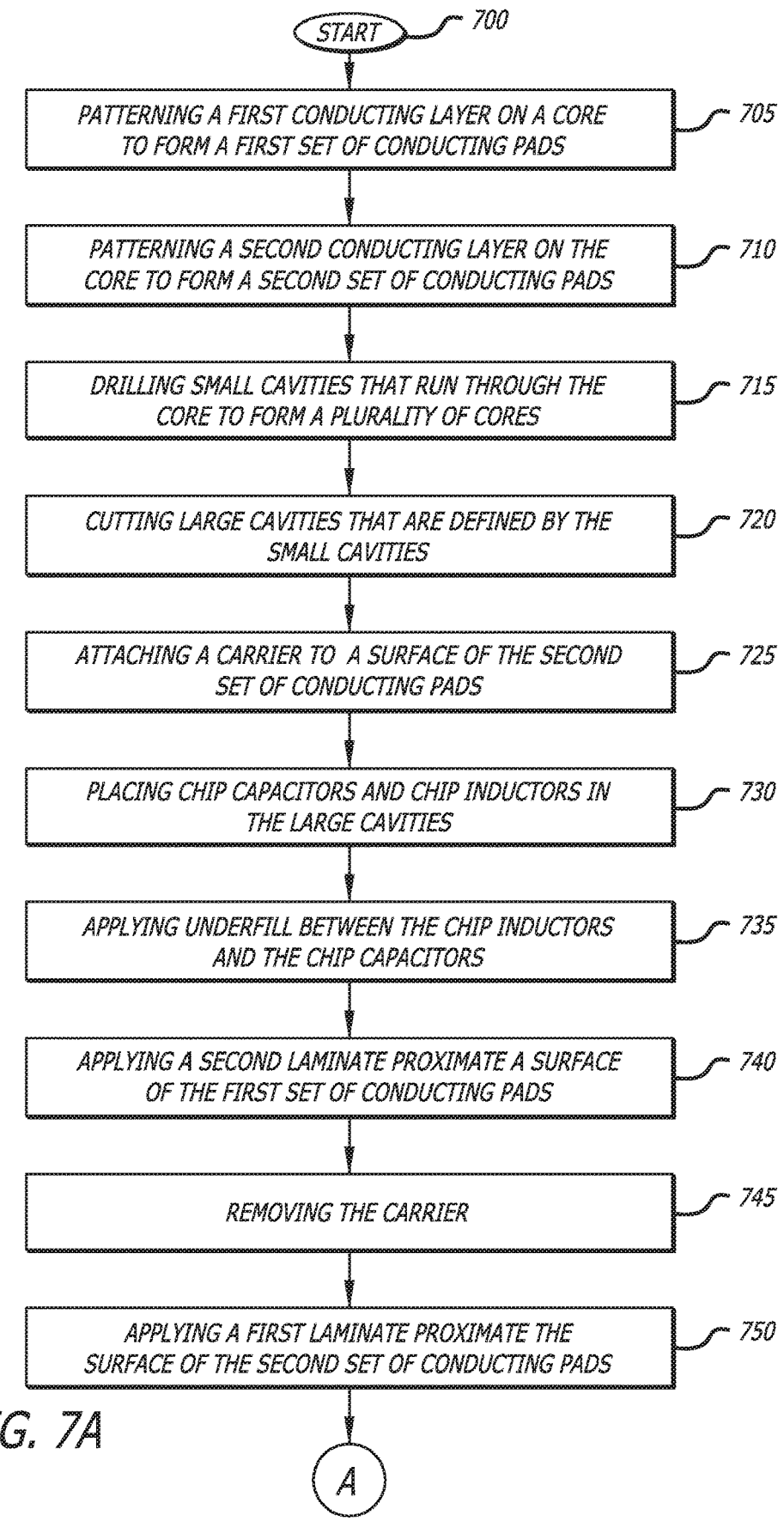
Figure 7B:
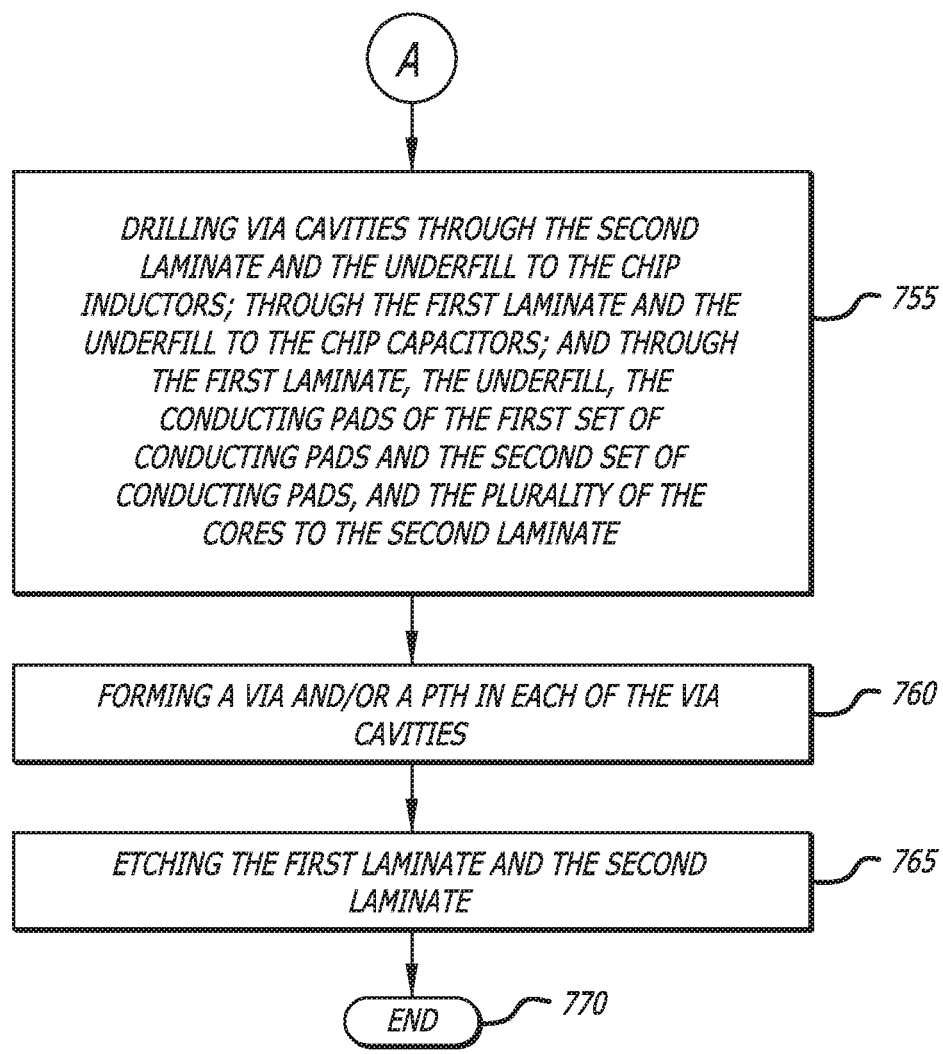

FIGS. 7A and 7B together are a flow chart showing the disclosed method of manufacture for the disclosed embedded type HIS device (e.g., refer to device 305 of FIGS. 3A and 3B), in accordance with at least one embodiment of the present disclosure.

Figure 8:
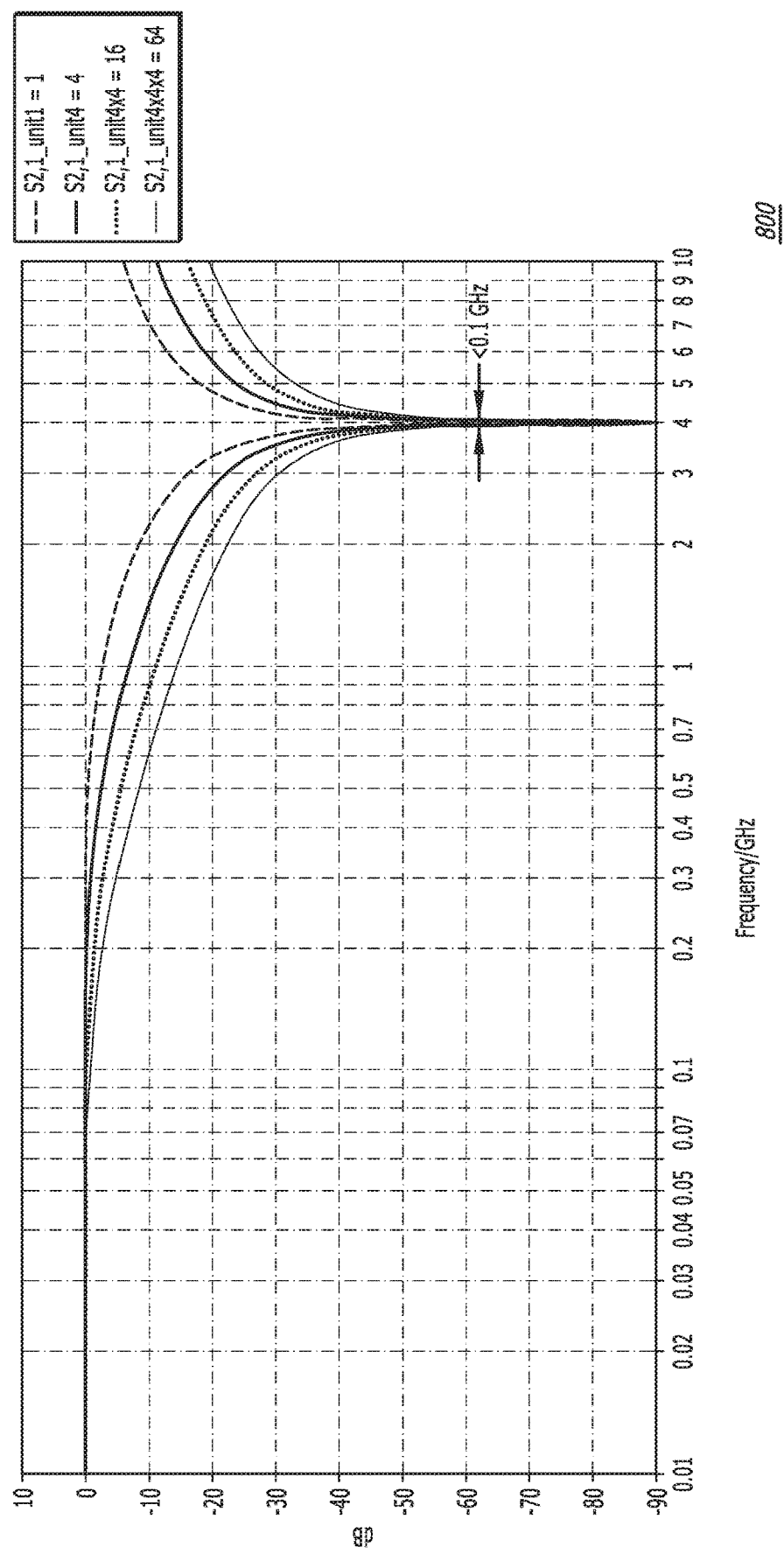

FIG. 8 is a graph showing exemplary insertion loss for a conventional high impedance surface (HIS) device (e.g., refer to device 105 of FIGS. 1A and 1B) comprising various numbers (e.g., 1, 4, 16, and 64) of HIS unit cells.

Figure 9:
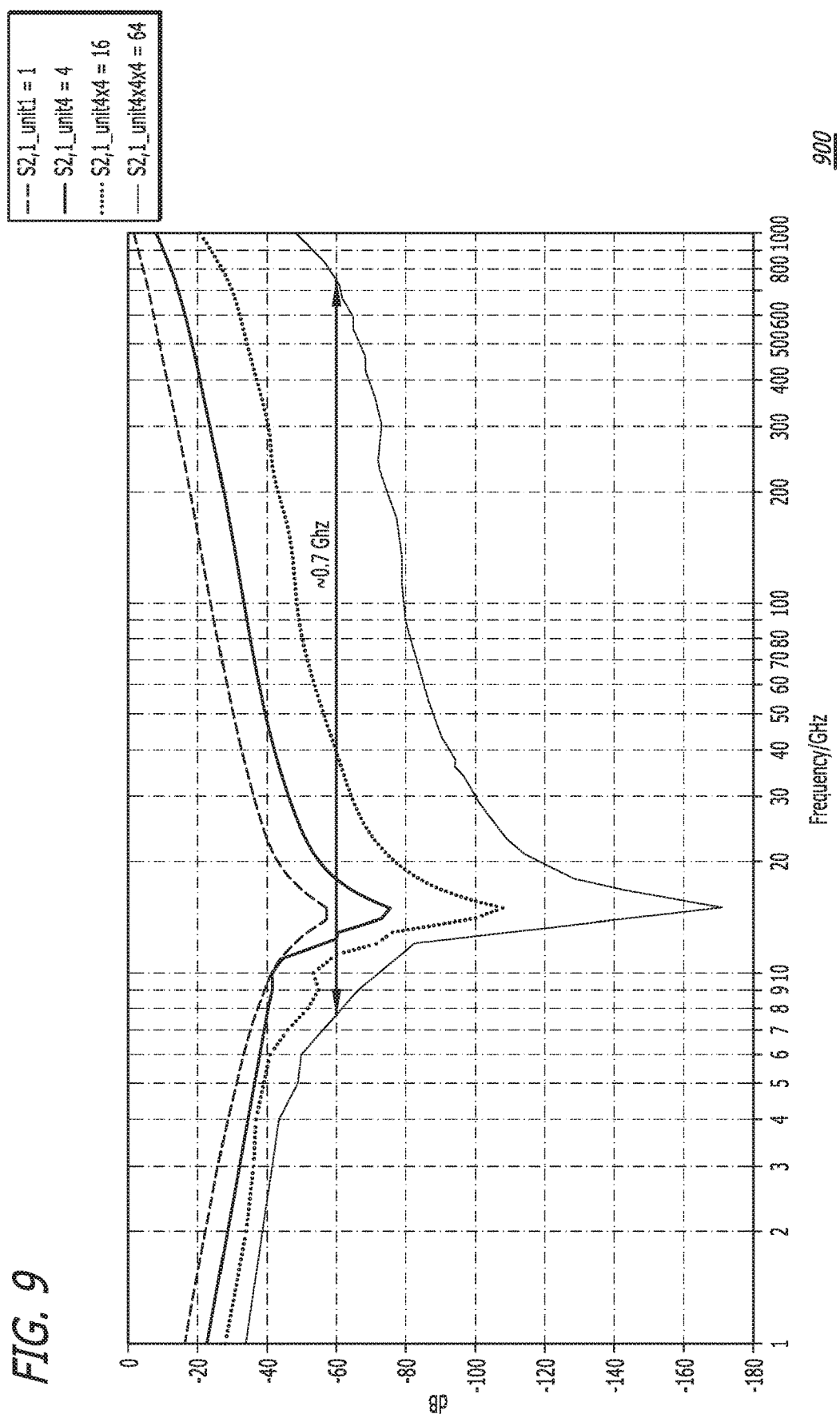

FIG. 9 is a graph showing exemplary insertion loss for the disclosed SMT type HIS device (e.g., refer to device 205 of FIGS. 2A, 2B, and 2C) comprising various numbers (e.g., 1, 4, 16, and 64) of HIS unit cells.

DESCRIPTION

The methods and apparatus disclosed herein provide operative systems for high impedance surfaces enhanced by discrete passives. In one or more embodiments, the systems of the present disclosure provide high impedance surface structures to realize low frequency (approximately MHz) stop bands in a light weight, compact form factor. Specifically, the disclosed systems comprise two different types of HIS devices, which are a surface-mount technology (SMT) type HIS device and an embedded type HIS device.

In particular, the disclosed systems (i.e. disclosed HIS devices) utilize high density inductance and capacitance provided by modern discrete passives to enable a wide frequency stop band starting from a few MHz up to a GHz range. In particular, the disclosed systems employ on-substrate integration of discrete inductor devices with high impedance capacities paired with discrete capacitor devices with designated capacitance values to realize extremely low frequency stop bands (e.g., in the MHz ranges). Positions and/or nominal values of the discrete passives (e.g., discrete capacitors and discrete inductors) within the disclosed systems can be varied to provide optimized frequency stop bands over multiple bands. In addition, it should be noted that other kinds of discrete passives or active or bias circuits may be added to the disclosed HIS devices to realize additional functionalities.

The disclosed systems (e.g., physical structures) are readily applicable to many applications in systems and/or subsystems in aerospace engineering to suppress electromagnetic waves from creeping on, for example, PCBs, antennas ground planes, and/or other various aircraft surfaces.

The systems of the present disclosure provide a number of advantages. A first advantage is that the disclosed systems provide a wide frequency stop band starting from a few MHz up to a GHz range, which is enabled by large inductance and capacitance provided by discrete passives, to prevent propagation of electromagnetic waves from creeping on conducting surfaces. A second advantage is that the disclosed systems each comprise a small, compact HIS array area realized by high density inductance and capacitance discrete passives. The disclosed systems have a third advantage of comprising a HIS aided by a flexible substrate so that the HIS can be manufactured to be conformal to curvilinear surfaces for aerospace applications. A fourth advantage is that the disclosed systems can employ various different inductance and/or capacitance values within the HIS array to further extend the frequency stop bands so as to achieve filtering characteristics similar to multi-band filter banks.

In the following description, numerous details are set forth in order to provide a more thorough description of the system. It will be apparent, however, to one skilled in the art, that the disclosed system may be practiced without these specific details. In the other instances, well known features have not been described in detail, so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the systems described herein are merely example embodiments of the present disclosure.

For the sake of brevity, conventional techniques and components related to high impedance surfaces, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in one or more embodiments of the present disclosure.

I. System Architectures

A. Conventional High Impedance Surface (HIS) Device

FIG. 1A is a diagram showing a top view 100 of a conventional high impedance surface (HIS) device 105. In this figure, the conventional HIS device 105 is shown to comprise an array of conductors (which are typically mushroom-shaped) 110 on a ground plane 130. The conductors 110 are typically metallic (e.g., manufactured from copper).

FIG. 1B is a diagram showing a side view 150 of the conventional HIS device 105 of FIG. 1A. Each of the conductors 110 is connected to the ground plane 130 by a via 120. It should be noted that each conductor 110 of the conventional HIS device 105 denotes a unit cell.

As previously mentioned above, a conventional HIS device 105 is very bulky in size and heavy in weight. Additionally, a conventional HIS device 105 generally has stop bands that only cover high frequency ranges (greater than (>) Gigahertz (GHz)) with limited bandwidth, which are not in the Megahertz (MHz) ranges where most of the spectral energy in digital noise signals exists.

B. Surface-Mount Technology (SMT) Type HIS Device

FIG. 2A is a diagram showing a top view 200 of the disclosed surface-mount technology (SMT) type HIS device 205, in accordance with at least one embodiment of the present disclosure. In this figure, the SMT type HIS device 205 is shown to comprise a plurality of conducting pads (i.e. conductors) 220 and a plurality of chip capacitors 210. It should be noted that FIG. 2A shows a first set of conducting pads 220 of the SMT type HIS device 205. The conducting pads 220 of FIG. 2A are arranged in an array, and the conducting pads 220 all lie in plane. The conducting pads 220 may be manufactured from a metal (e.g., copper), and may be formed of various different shapes including, but not limited to, square (as shown), rectangular, and circular. Each conducting pad 220 of the SMT type HIS device 205 denotes a unit cell.

Also in this figure, a portion of each of the chip capacitors 210 is connected to the conducting pads 220. The chip capacitors 210 are soldered to the conducting pads 220 using industry standard SMT processes. The conducting pads 220 are connected together by the chip capacitors 210, and the chip capacitors 210 are connected to the conducting pads 220 in a symmetric pattern.

FIG. 2B is a diagram showing a bottom view 250 of the disclosed SMT type HIS device 205 of FIG. 2A, in accordance with at least one embodiment of the present disclosure. In this figure, the SMT type HIS device 205 is shown to comprise a plurality of conducting pads (i.e. conductors) 220 and a plurality of chip inductors 230. It should be noted that the conducting pads 220 of FIG. 2B are a second set of conducting pads 220 of the SMT type HIS device 205. Similar to the conducting pads 220 of FIG. 2A, the conducting pads 220 of FIG. 2B are arranged in an array, and the conducting pads 220 all lie in plane. The conducting pads 220 may be manufactured from a metal (e.g., copper).

Also shown in FIG. 2B, a portion of each of the chip inductors 230 is connected to the conducting pads 220. The chip inductors 230 are soldered to the conducting pads 220 using industry standard SMT processes. The conducting pads 220 are connected together by the chip inductors 230, and the chip inductors 230 are connected to the conducting pads 220 in a symmetric pattern.

FIG. 2C is a diagram showing a side view 270 of the disclosed SMT type HIS device 205 of FIGS. 2A and 2B, in accordance with at least one embodiment of the present disclosure. In this figure, the SMT type HIS device 205 is shown to further comprise a core 240 and vias 260. The core 240 is an insulator, and may be manufactured from a mixture of an epoxy along with a core substrate (e.g., fiberglass). In some embodiments, the core 240 is mechanically flexible such that the SMT type HIS device 205 is conformable for particular applications. In other embodiments, the core 240 may be rigid in accordance with intended applications. The vias 260 may be manufactured from a metal, such as copper.

Also shown in this figure, the first set of conducting pads 220 is shown to be connected to one side of a core 240, and the second set of conducting pads 220 is shown to be connected to an opposite side of the core 240. The first set of conducting pads 220 and the second set of conducting pads 220 are connected to each other by vias 260 running through the core 240.

It should be noted that, unlike the conventional HIS devices 105 (refer to FIGS. 1A and 1B), the conducting pad 220 patterns are symmetric on both sides of the SMT type HIS device 205. Also, in other embodiments, the chip capacitor 210 and chip inductor 230 positions on the SMT type HIS device 205 can be interchangeable.

C. Embedded Type HIS Device

Figure 3B:
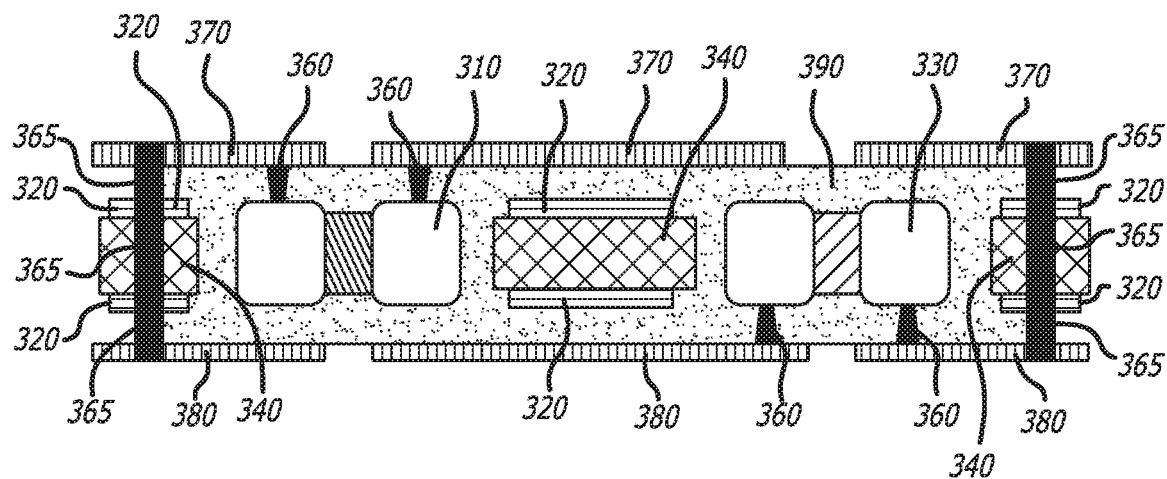
FIG. 3B is a diagram showing a side view of the disclosed embedded type HIS device of FIG. 3A, in accordance with at least one embodiment of the present disclosure.

FIG. 3A is a diagram showing a top view 300 of the disclosed embedded type HIS device 305, in accordance with at least one embodiment of the present disclosure. In this figure, the embedded type HIS device 305 is shown to comprise a plurality of conducting pads (i.e. conductors) 320, a plurality of chip capacitors 310, and a plurality of chip inductors 330. It should be noted that FIG. 3A shows a first set of conducting pads 320 of the embedded type HIS device 305. A second set of conducting pads 320 for the embedded type HIS device 305 will look similar to the first set of conducting pads 320 as shown in FIG. 3A (refer also to FIG. 3B). The conducting pads 320 of FIG. 3A are arranged in an array, and the conducting pads 320 all lie in plane. The conducting pads 320 may be manufactured from a metal (e.g., copper), and may be formed of various different shapes including, but not limited to, square (as shown), rectangular, and circular. It should be noted that each conducting pad 320 of the embedded type HIS device 305 denotes a unit cell.

Also in this figure, a portion of each of the chip capacitors 310 and the chip inductors 330 is connected to the conducting pads 320 as shown. The conducting pads 320 are connected together by the chip capacitors 310 and the chip inductors 330, and the chip capacitors 310 and the chip inductors 330 are connected to the conducting pads 320 in a symmetric pattern. The chip capacitor 310 and chip inductor 330 positions within the embedded type HIS device 305 can be interchangeable. The chip capacitors 310 and the chip inductors 330 (i.e. discrete passives) are embedded inside the embedded type HIS device 305 to provide a low-profile embodiment.

FIG. 3B is a diagram showing a side view 350 of the disclosed embedded type HIS device 305 of FIG. 3A, in accordance with at least one embodiment of the present disclosure. In this figure, the embedded type HIS device 305 is shown to also include a plurality of cores 340, a plurality of vias 360, underfill (e.g., resin) 390, and laminates 370, 380. The cores 340 are insulators, and may be manufactured from a mixture of an epoxy along with a core substrate, such as fiberglass. In one or more embodiments, the cores 340 and underfill 390 are mechanically flexible such that the embedded type HIS device 305 may be conformable for particular applications. In other embodiments, the cores 340 and underfill 390 may be rigid in accordance with intended applications. The vias 360 may be manufactured from a metal, such as copper.

As shown in this figure, the cores 340 are embedded between the first set of conducting pads 320 and the second set of conducting pads 320. The first set of conducting pads 320 and the second set of conducting pads 320 are connected to each other by plated through holes (PTHs) 365 running through the conducting pads 320 and the cores 340. In addition, as shown in FIG. 3B, the chip inductors 330 are connected to at least one laminate 380 by at least one via 360, and the chip capacitors 310 are connected to at least one laminate 370 by at least one via 360.

The cores 340, the chip inductors 330, and the chip capacitors 310 are all embedded in an underfill 390, which may comprise a dielectric epoxy. In addition, in one or more embodiments, the cores 340, the chip inductors 330, and the chip capacitors 310 all lie in a plane. Also, as shown in FIG. 3B, each of the cores 340 is located between a chip inductor 330 and a chip capacitor 310.

II. Methods of Manufacture

Figure 4A:
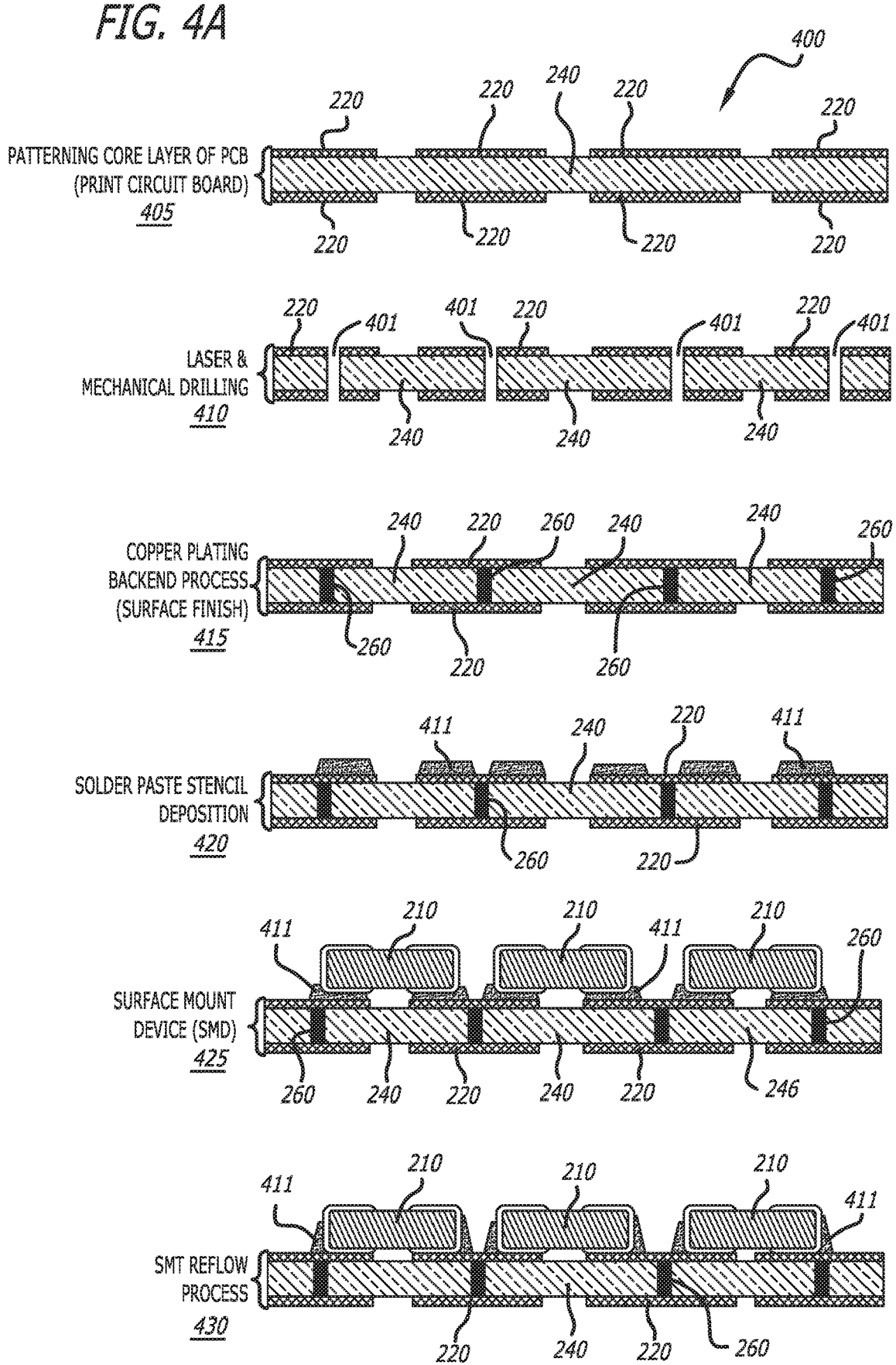

FIGS. 4A and 4B are diagrams that together illustrate the disclosed method 400 of manufacture for the disclosed SMT type HIS device (e.g., refer to device 205 of FIGS. 2A, 2B, and 2C), in accordance with at least one embodiment of the present disclosure. At the start of the method 400, at step 405, the core 240 (e.g., a core of a printed circuit board (PCB)) is patterned to form conducting pads 220. Then, at step 410, cavities 401 that run through the conducting pads 220 and the core 240 are drilled (e.g., by laser drilling and/or mechanical drilling). At step 415, a surface of the conducting pads 220 is plated (e.g., with a metal, such as copper plating), and vias (e.g., copper) 260 are formed in each of the cavities 401.

Then, at step 420, solder paste 411 is applied (e.g., through stencil deposition) to some of the conducting pads 220. At step 425, chip capacitors 210 are placed on the solder paste 411. Then, at step 430, the solder paste 411 is reflowed. At step 435, underfill 421 (e.g., a dielectric epoxy) is applied between the chip capacitors 210.

Then, at step 440, solder paste 431 is applied (e.g., through stencil deposition) to the remaining conducting pads 220. At step 445, chip inductors 230 are placed on the solder paste 431, and the solder paste 431 is reflowed. At step 450, underfill 441 (e.g., a dielectric epoxy) is applied between the chip inductors 230. Then, the method 400 ends.

Figure 5B:
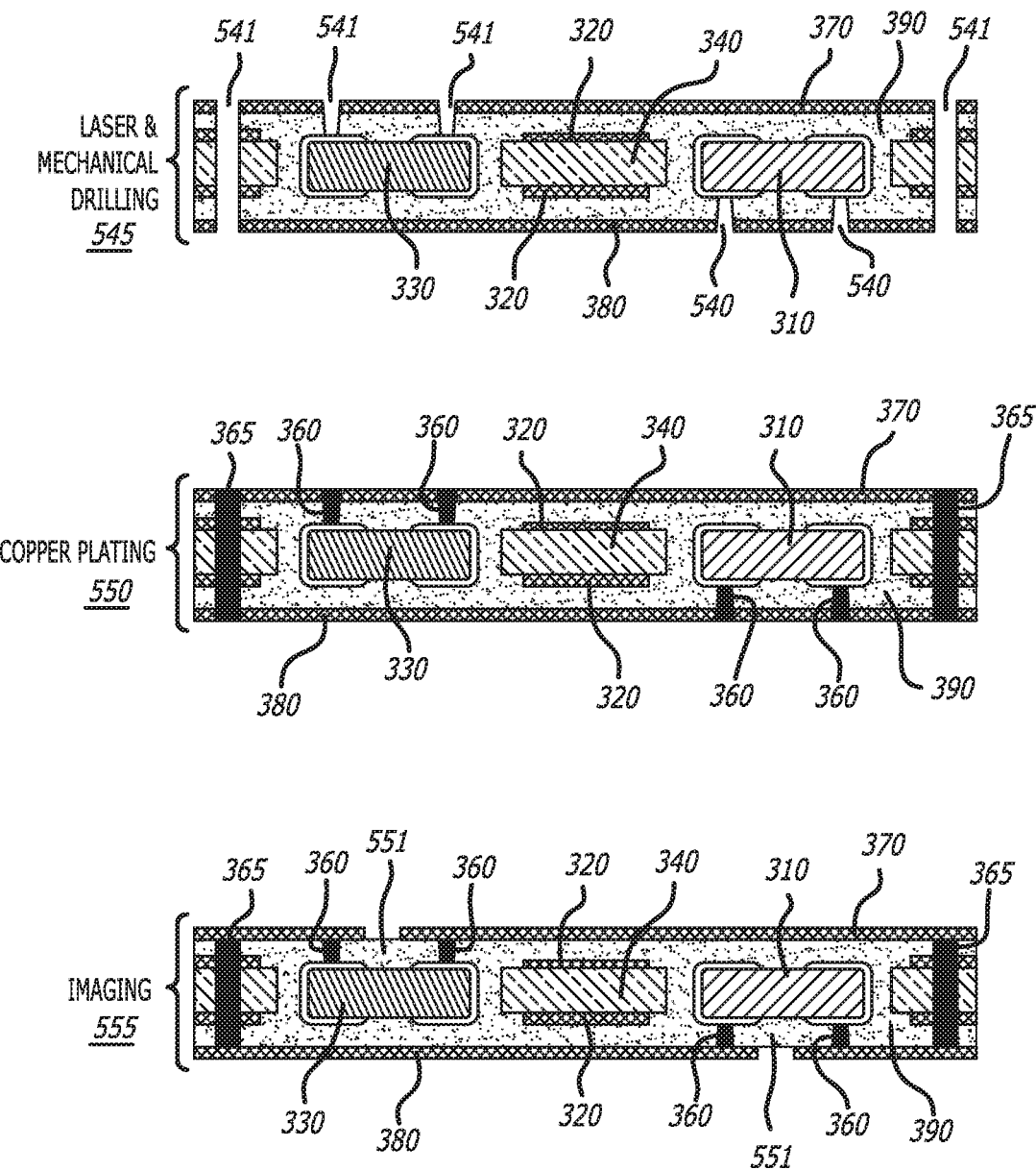

FIGS. 5A and 5B are diagrams that together illustrate the method 500 of manufacture for the disclosed embedded type HIS device (e.g., refer to device 305 of FIGS. 3A and 3B), in accordance with at least one embodiment of the present disclosure. At the start of the method 500, at step 505, the core 340 (e.g., a core of a printed circuit board (PCB)) is patterned to form conducting pads 320. Then, at step 510, small cavities 501 that run through the core 340 are drilled (e.g., by laser drilling and/or mechanical drilling). At step 515, large cavities 506, which are defined by the small cavities 501, are cut (e.g., by laser drilling and/or mechanical drilling).

Then, at step 520, a carrier (e.g., a substrate) 511 is attached to a surface of some of the conducting pads 320. At step 525, chip capacitors 310 and chip inductors 330 are placed within the large cavities 506, and an automated optical inspection (AOI) is performed. At step 530, underfill (e.g., a dielectric epoxy) 390 is applied between the chip capacitors 310 and the chip inductors 330; and a second laminate (e.g., a metal) 380 is applied proximate a surface of some of the conducting pads 320. Then, at step 535, the carrier 511 is removed.

Then, at step 540, a first laminate (e.g., a metal) 370 is applied proximate a surface of the remaining conducting pads 320. Then, at step 545, via cavities 541 are drilled (e.g., by laser drilling and/or mechanical drilling) (1) through the second laminate 380 and the underfill 390 to the chip inductors 330; (2) through the first laminate 370 and the underfill 390 to the chip capacitors 310; and (3) through the first laminate 370, the underfill 390, the conducting pads 320, and the cores 340 to the second laminate 380.

At step 550, at least one via 360 and/or at least one plated through hole (PTH) 365 are formed within at least one via cavity 541. Then, the first laminate 370 and the second laminate 380 are etched (e.g., by photolithography).

FIGS. 6A and 6B together are a flow chart showing the disclosed method of manufacture for the disclosed SMT type HIS device (e.g., refer to device 205 of FIGS. 2A, 2B, and 2C), in accordance with at least one embodiment of the present disclosure. At the start 600 of the method, a first conducting layer on a core is patterned to form a first set of conducting pads 605. Then, a second conducting layer on the core is patterned to form a second set of conducting pads 610. Cavities are then drilled that run through the first set of conducting pads, the core, and the second set of conducting pads 615. Then, a via in each of the cavities is formed 620. Then, a surface of each of the conducting pads of the first set of conducting pads and the second set of conducting pads is plated 625.

Solder paste is then applied to each of the conducting pads of the second set of conducting pads 630. Then, chip capacitors are placed on the solder paste on the second set of conducting pads 635. The solder paste is then reflowed on the second set of conducting pads 640. Then, underfill is applied between the chip capacitors 645. Solder paste is then applied to each of the conducting pads of the first set of conducting pads 650. Then, chip inductors are placed on the solder paste on the first set of conducting pads 655. The solder paste is then reflowed on the first set of conducting pads 660. Then, underfill is applied between the chip inductors 655. Then, the method ends 670.

FIGS. 7A and 7B together are a flow chart showing the disclosed method of manufacture for the disclosed embedded type HIS device (e.g., refer to FIGS. 3A and 3B), in accordance with at least one embodiment of the present disclosure. At the start 700 of the method, a first conducting layer on a core is patterned to form a first set of conducting pads 705. Then, a second conducting layer on the core is patterned to form a second set of conducting pads 710. Small cavities that run through the core are then drilled to form a plurality of cores 715. Then, large cavities that are defined by the small cavities are cut 720.

Then, a carrier is attached to a surface of the second set of conducting pads 725. Chip capacitors and chip inductors are then placed in the large cavities 730. Then, underfill is applied between the chip inductors and the chip capacitors 735. A second laminate is then applied proximate a surface of the first set of conducting pads 740. Then, the carrier is removed 745. A first laminate is applied proximate the surface of the second set of conducting pads 750. Then, via cavities are drilled (1) through the second laminate and the underfill to the chip inductors; (2) through the first laminate and the underfill to the chip capacitors; and (3) through the first laminate, the underfill, the conducting pads of the first set of conducting pads and the second set of conducting pads, and the plurality of cores to the second laminate 755. A via and/or a plated through hole (PTH) is then formed in each of the via cavities 760. The first laminate and the second laminate are then etched 765. Then, the method ends 770.

III. Simulation Data

FIG. 8 is a graph 800 showing exemplary insertion loss for a conventional high impedance surface (HIS) device (e.g., refer to device 105 of FIGS. 1A and 1B) comprising various numbers (e.g., 1, 4, 16, and 64) of HIS unit cells. As shown in graph 800, the conventional HIS device 105 exhibits a very narrow frequency stop band in the GHz range. In particular, the conventional HIS device 105 exhibits a frequency stop band of less than a 0.1 GHz bandwidth at 60 decibels (dB) down at 4 GHz.

FIG. 9 is a graph 900 showing exemplary insertion loss for the disclosed SMT type HIS device (e.g., refer to device 205 of FIGS. 2A, 2B, and 2C) comprising various numbers (e.g., 1, 4, 16, and 64) of HIS unit cells. As shown in graph 900, the disclosed SMT type HIS device 205 provides a very wide frequency stop band in the MHz to GHz range. In particular, the disclosed SMT type HIS device 205 exhibits a frequency stop band of approximately a 0.7 GHz bandwidth at 60 decibels (dB) down from 8 to 750 GHz.

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of this disclosure. Many other examples exist, each differing from others in matters of detail only. Accordingly, it is intended that this disclosure be limited only to the extent required by the appended claims and the rules and principles of applicable law.

We claim:

1. A method of manufacturing a high impedance surface (HIS) apparatus, wherein the method comprises:
    patterning a first conducting layer on a core to form a first set of conducting pads;
    patterning a second conducting layer on the core to form a second set of conducting pads;
    drilling cavities that run through the first set of conducting pads, the core, and the second set of conducting pads;
    forming a via in each of the cavities;
    plating a surface of each of the conducting pads of the first set of conducting pads and the second set of conducting pads;
    applying solder paste to each of the conducting pads of the second set of conducting pads;
    placing chip capacitors on the solder paste on the second set of conducting pads;
    reflowing the solder paste on the second set of conducting pads;
    applying underfill between the chip capacitors;
    applying solder paste to each of the conducting pads of the first set of conducting pads;
    placing chip inductors on the solder paste on the first set of conducting pads;

reflowing the solder paste on the first set of conducting pads; and applying underfill between the chip inductors.

2. The method of claim 1, wherein the cavities are drilled by at least one of laser drilling or mechanical drilling.

3. The method of claim 1, wherein the surface of each of the conducting pads of the first set of conducting pads and the second set of conducting pads is plated with a metal.

4. The method of claim 1, wherein the solder paste is applied to each of the conducting pads of the first set of conducting pads and the second set of conducting pads through stencil deposition.

5. The method of claim 1, wherein the underfill between the chip capacitors and the underfill in between the chip inductors is a dielectric epoxy.

6. The method of claim 1, wherein the core is mechanically flexible such that the apparatus is conformable.

7. The method of claim 1, wherein the surface of each of the conducting pads of the first set of conducting pads and the second set of conducting pads is plated with a metal.

8. The method of claim 7, wherein the metal is copper (Cu).

9. The method of claim 1, wherein the core is a printed circuit board (PCB) core.

10. A method of manufacturing a high impedance surface (HIS) apparatus, wherein the method comprises:
    patterning a first conducting layer on a core to form a first set of conducting pads;
    patterning a second conducting layer on the core to form a second set of conducting pads;
    drilling small cavities that run through the core to form a plurality of cores;
    cutting large cavities that are defined by the small cavities;
    attaching a carrier to a surface of the second set of conducting pads;
    placing chip capacitors and chip inductors in the large cavities;
    applying underfill between the chip inductors and the chip capacitors;
    applying a second laminate proximate a surface of the first set of conducting pads;
    removing the carrier;
    applying a first laminate proximate the surface of the second set of conducting pads;
    drilling via cavities through the second laminate and the underfill to the chip inductors, through the first laminate and the underfill to the chip capacitors, and through the first laminate, the underfill, the conducting pads of the first set of conducting pads and the second set of conducting pads, and the plurality of the cores to the second laminate;
    forming at least one of a via or plated through hole (PTH) in each of the via cavities; and
    etching the first laminate and the second laminate.

11. The method of claim 10, wherein the small cavities are drilled by at least one of laser drilling or mechanical drilling.

12. The method of claim 10, wherein the large cavities are drilled by at least one of laser drilling or mechanical drilling.

13. The method of claim 10, wherein the via cavities are drilled by at least one of laser drilling or mechanical drilling.

14. The method of claim 10, wherein the carrier is a substrate.

15. The method of claim 10, wherein the first laminate and the second laminate are a metal.

16. The method of claim 15, wherein the metal is copper (Cu).

17. The method of claim 10, wherein the underfill is a dielectric epoxy.

18. The method of claim 10, wherein the first laminate and the second laminate are etched by photolithography.

19. The method of claim 10, wherein the core is mechanically flexible such that the apparatus is conformable.

20. The method of claim 10, wherein the core is a printed circuit board (PCB) core.

* * * * *